United States Patent
Fournel et al.

(10) Patent No.: US 11,056,340 B2
(45) Date of Patent: Jul. 6, 2021

(54) DIRECT BONDING PROCESS

(71) Applicant: Commissariat a l'energie atomique et aux energies alternatives, Paris (FR)

(72) Inventors: Frank Fournel, Villard-Bonnot (FR); Frederic Mazen, Saint-Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 221 days.

(21) Appl. No.: 16/207,828

(22) Filed: Dec. 3, 2018

(65) Prior Publication Data
US 2019/0214258 A1 Jul. 11, 2019

(30) Foreign Application Priority Data
Dec. 8, 2017 (FR) ...................... 17 61829

(51) Int. Cl.
| | |
|---|---|
| *H01L 21/18* | (2006.01) |
| *H01L 21/762* | (2006.01) |
| *H01L 21/265* | (2006.01) |
| *H01L 21/324* | (2006.01) |
| *H01L 21/20* | (2006.01) |

(52) U.S. Cl.
CPC ...... *H01L 21/187* (2013.01); *H01L 21/26506* (2013.01); *H01L 21/324* (2013.01); *H01L 21/76254* (2013.01); *H01L 21/2007* (2013.01)

(58) Field of Classification Search
CPC ............. H01L 21/187; H01L 21/26506; H01L 21/324; H01L 21/76254
See application file for complete search history.

(56) References Cited

U.S. PATENT DOCUMENTS

| | | | |
|---|---|---|---|
| 9,589,801 B2* | 3/2017 | Herbots | ........ H01L 21/187 |
| 2015/0194337 A1 | 7/2015 | Moriceau et al. | |
| 2016/0233125 A1* | 8/2016 | Landru | ........ H01L 21/76254 |
| 2017/0133347 A1 | 5/2017 | Moriceau et al. | |

OTHER PUBLICATIONS

French Preliminary Search Report dated Oct. 23, 2018 in French Application 17 61829, filed on Dec. 8, 2017 (with English Translation of Categories of Cited Documents & Written Opinion).

* cited by examiner

*Primary Examiner* — Mark W Tornow
*Assistant Examiner* — Abbigale A Boyle
(74) *Attorney, Agent, or Firm* — Oblon, McClelland, Maier & Neustadt, L.L.P.

(57) ABSTRACT

A process for attaching a first substrate to a second substrate by direct bonding includes the successive steps of: a) providing the first and second substrates, each comprising a first surface and an opposite second surface, b) bonding the first substrate to the second substrate by direct bonding between the first surfaces of the first and second substrates, step b) being carried out under a first gaseous atmosphere having a first relative humidity level denoted by $\varphi_1$, and c) applying a thermal annealing treatment to the bonded first and second substrates at a thermal annealing temperature of between 20° C. and 700° C., step c) being carried out under a second gaseous atmosphere having a second humidity level denoted by $\varphi_2$, satisfying $\varphi_2 \geq \varphi_1$.

14 Claims, 2 Drawing Sheets

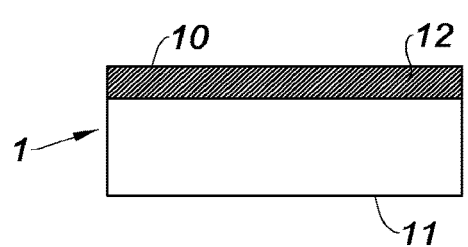
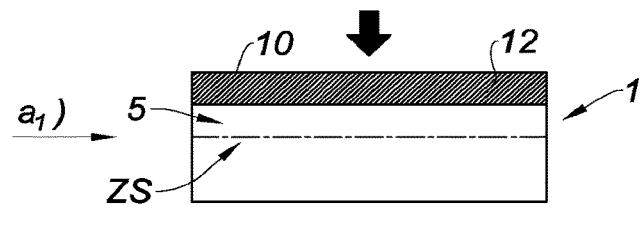
Fig. 3a
Fig. 3b
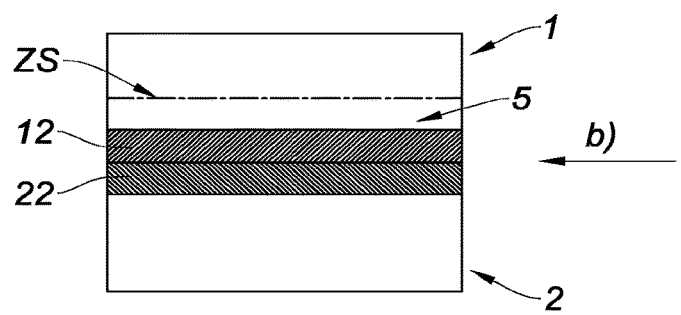
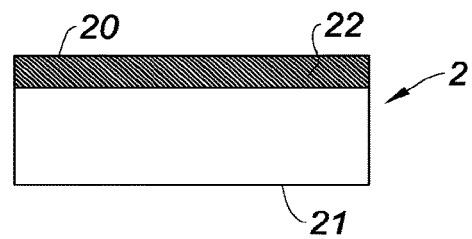
Fig. 3d
Fig. 3c
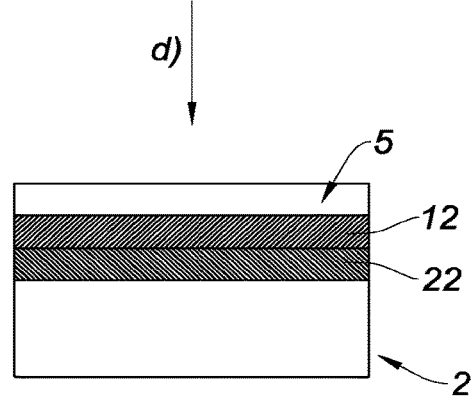
Fig. 3e

DIRECT BONDING PROCESS

TECHNICAL FIELD

The invention relates to the technical field of attaching two substrates to one another by direct bonding.

A particular application of the invention is in the transfer of thin layers using the Smart Cut™ technique.

STATE OF THE PRIOR ART

In relation to a process for attaching a first substrate to a second substrate by direct bonding, achieved by bringing two surfaces into direct contact, it is known that such a process is liable to result in a lack of uniformity in the adhesion energy (also referred to as the bonding energy, and expressed in $J/m^2$), i.e. the energy needed to separate the two surfaces after the bonding thereof. In particular, this lack of uniformity in the adhesion energy manifests as an adhesion energy that is lower at the edges of the two surfaces than in a central portion of the two surfaces. By way of example, the difference in adhesion energy between the edges (for example over a distance of 1 cm) and a central portion of the two surfaces may reach 700 $mJ/m^2$ for two silicon substrates covered with an oxide layer and each having a diameter of 200 mm.

Moreover, in the case of transferring thin layers by means of the Smart Cut™ technique, a substantial lack of uniformity in the adhesion energy may result in the two substrates debonding during the splitting step, with the presence of non-transferred zones and defects.

Those skilled in the art therefore seek a direct bonding process allowing the most uniform possible adhesion energy of the surfaces in contact to be obtained.

DISCLOSURE OF THE INVENTION

The invention aims to completely or partly overcome the aforementioned drawbacks. To this end, a subject of the invention is a process for attaching a first substrate to a second substrate by direct bonding including the successive steps of:

a) providing the first and second substrates, each comprising a first surface and an opposite second surface;

b) attaching the first substrate to the second substrate by direct bonding between the first surfaces of the first and second substrates, step b) being carried out under a first gaseous atmosphere having a first relative humidity level denoted by $\varphi_1$;

c) applying a thermal annealing treatment to the bonded first and second substrates at a thermal annealing temperature of between 20° C. and 700° C., step c) being carried out under a second gaseous atmosphere having a second humidity level denoted by $\varphi_2$, satisfying $\varphi_2 \geq \varphi_1$.

Thus, such a process according to the invention allows, by virtue of step c), the uniformity of the adhesion energy of the first surfaces of the first and second substrates to be significantly improved. Specifically, the inventors have experimentally observed that the amount of water vapour in the thermal annealing atmosphere has an effect on the uniformity of the adhesion energy. More precisely, at least maintaining the relative humidity level after bonding step b) allows the uniformity of the adhesion energy to be significantly improved by preventing the water present at the bonding interface, at the edge of the substrate, from diffusing out of the bonding interface. In other words, the bonded first and second substrates are kept, after step b) and including during the execution of step c), under an atmosphere having a humidity level that is higher than or equal to a $\varphi_1$ so as to homogenize the adhesion energy of the first surfaces of the first and second substrates.

Definitions

The term "substrate" is understood to mean a self-supporting physical carrier, produced in a base material allowing an electronic device or an electronic component to be fabricated. A substrate is conventionally a wafer cut from a monocrystalline ingot of semiconductor material.

The term "direct bonding" is understood to mean spontaneous bonding resulting from two surfaces being brought into contact, i.e. bonding in the absence of an additional element such as an adhesive, a wax or a solder. The bonding is mainly the result of van der Waals forces from the electronic interaction between the atoms or molecules of two surfaces, hydrogen bonds due to surface preparations or covalent bonds formed between the two surfaces. The terms "molecular bonding" and "direct bonding" are also used. Direct bonding is advantageously carried out at ambient temperature and pressure, and should not be conflated with thermocompression bonding, eutectic bonding or anodic bonding. Direct bonding may be followed by thermal annealing for strengthening the bonding interface.

The term "thermal annealing" is understood to mean a heat treatment including a heating cycle with:
- a first phase of gradually increasing the temperature until a plateau value is reached;
- a second phase in which the heating temperature is maintained at the plateau value; and
- a third, cooling phase.

The thermal annealing temperature is the plateau value of the heating temperature.

The term "relative humidity level" is understood to mean the ratio (expressed as a percentage) of the amount of water vapour contained in a given volume of gas to the maximum amount of water vapour that the given volume of gas is capable of holding. The relative humidity level depends on the temperature of the gas and on the pressure of the gas. The relative humidity level may also be expressed as the ratio (expressed as a percentage) of the partial pressure of the water vapour contained in a volume of gas to the saturated vapour pressure of water.

The process according to the invention may include one or more of the following features.

According to one feature of the invention, water exhibits a saturated vapour pressure within the second gaseous atmosphere denoted by $P_{sat}$, and step c) includes the steps of:

$c_1$) gradually increasing a heating temperature of the second gaseous atmosphere until reaching the thermal annealing temperature;

$c_2$) measuring progressive heating temperatures over step $c_1$) and determining $P_{sat}$ for the measured progressive heating temperatures;

$c_3$) gradually increasing, over step $c_1$), the partial water vapour pressure, denoted by $p_v$, within the second gaseous atmosphere such that $p_v \geq P_{sat} \varphi_1$.

Thus, it is possible to adjust $\varphi_2$ (equal to the ratio of $p_v$ to $P_{sat}$) throughout step $c_1$) of increasing the temperature such that the relation $\varphi_2 \geq \varphi_1$ can be satisfied.

According to one feature of the invention, $\varphi_2$ is equal to 100%.

Thus, an advantage afforded is that of simplifying the process by saturating the second gaseous atmosphere with water vapour, thereby ensuring that the relation $\varphi_2 \geq \varphi_1$ is always satisfied.

According to one feature of the invention, step c) is carried out such that the second gaseous atmosphere exhibits a constant pressure.

Thus, an advantage afforded is that of simplifying the adjustment of $\varphi_2$, which also depends on the pressure of the second gaseous atmosphere.

According to one feature of the invention, the first and second gaseous atmospheres include air.

According to one feature of the invention, step c) is carried out in an oven injecting water vapour, produced by means of ultrasound, into the second gaseous atmosphere.

Thus, an advantage afforded by injecting water vapour produced by means of ultrasound is that of being able to easily implement an oven which, conventionally, allows only dry atmospheres for relatively low temperatures (i.e. temperatures of less than 700° C.).

According to one feature of the invention, the thermal annealing temperature is between 20° C. and 500° C., preferably between 100° C. and 500° C., more preferentially between 200° C. and 400° C., even more preferentially between 250° C. and 350° C.

According to one feature of the invention, step a) includes a step $a_1$) consisting in implanting gaseous species into the first substrate, through the first surface, so as to form a weakened zone, a useful layer being delimited by the weakened zone and by the first surface of the first substrate; and the thermal annealing treatment is applied in step c) according to a thermal budget that is suitable for splitting the first substrate along the weakened zone so as to expose the useful layer.

Thus, an advantage afforded is that of being able to transfer the useful layer to the second substrate by means of Smart Cut™.

According to one feature of the invention, step a) includes a step $a_1$) consisting in implanting gaseous species into the first substrate, through the first surface, so as to form a weakened zone, a useful layer being delimited by the weakened zone and by the first surface of the first substrate); and step c) is followed by a step d) consisting in splitting the first substrate along the weakened zone so as to expose the useful layer.

Thus, the thermal annealing treatment may be applied in step c) according to a thermal budget corresponding to a fraction (e.g. between 50% and 80%) of the thermal budget needed to split the first substrate along the weakened zone. Such a thermal budget of step c) makes it possible to provide a strong bond at the substrate edge such that step d) may be carried out under a less humid, or even dry, atmosphere. Step d) may be carried out by means of a complementary heat treatment that is suitable for splitting the first substrate along the weakened zone.

According to one feature of the invention, the first surfaces of the first and second substrates are produced in a material selected from Si, $SiO_2$, Ge, $Al_2O_3$, SiC, AsGa, InP, GaN, $LiNbO_3$, $LiTaO_3$.

According to one feature of the invention, step b) is carried out at a temperature of between 20° C. and 30° C.

BRIEF DESCRIPTION OF THE DRAWINGS

Other features and advantages will become apparent in the detailed description of various embodiments of the invention, the description being accompanied by examples and references to the appended drawings.

FIGS. 3a to 3e are sectional schematic views along the normal to the first and second surfaces of the first and second substrates, illustrating steps of a process according to the invention in the case of transferring a useful layer by means of the Smart Cut™ technique.

FIG. 1 and FIGS. 3a to 3e are not shown to scale in order to facilitate the understanding thereof.

DETAILED DESCRIPTION OF EMBODIMENTS

Figure 1:
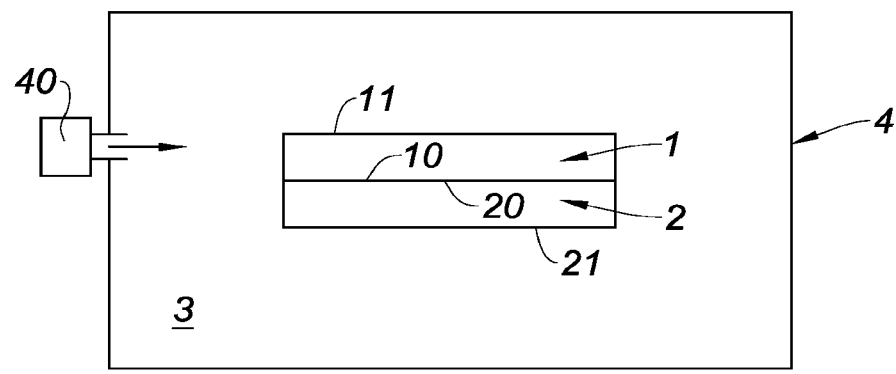
FIG. 1 is a sectional schematic view along the normal to the first and second surfaces of the first and second substrates, illustrating step c) of a process according to the invention.

Those elements that are identical or perform the same function bear the same references for the various embodiments, for the sake of simplicity.

A subject of the invention is a process for attaching a first substrate 1 to a second substrate 2 by direct bonding including the successive steps of:

a) providing the first and second substrates 1, 2, each comprising a first surface 10, 20 and an opposite second surface 11, 21;

b) bonding the first substrate 1 to the second substrate 2 by direct bonding between the first surfaces 10, 20 of the first and second substrates 1, 2, step b) being carried out under a first gaseous atmosphere having a first relative humidity level denoted by $\varphi_1$;

c) applying a thermal annealing treatment to the bonded first and second substrates 1, 2 at a thermal annealing temperature of between 20° C. and 700° C., step c) being carried out under a second gaseous atmosphere 3 having a second humidity level denoted by $\varphi_2$, satisfying $\varphi_2 \geq \varphi_1$.

First and Second Substrates

The first and/or second substrates 1, 2 may be produced in a semiconductor material. The first and/or second substrates 1, 2 may include a surface layer 12, 22 such as an oxide layer, as illustrated in FIGS. 3a to 3e.

The first surfaces 10, 20 of the first and second substrates 1, 2 are advantageously produced in a material selected from Si, $SiO_2$, Ge, $Al_2O_3$, SiC, AsGa, InP, GaN, $LiNbO_3$, $LiTaO_3$.

Bonding Step b)

The first gaseous atmosphere may include air. Step b) is preferably carried out at ambient temperature, i.e. at a temperature of between 20° C. and 30° C. Step b) may be carried out at ambient pressure or in vacuum.

Thermal Annealing Step c)

The second gaseous atmosphere 3 may include air. Step c) is advantageously carried out such that the second gaseous atmosphere 3 exhibits a constant pressure. As illustrated in FIG. 1, step c) is advantageously carried out in an oven 4 injecting, using an injector 40, water vapour into the second gaseous atmosphere 3. The water vapour is advantageously produced by means of ultrasound. The thermal annealing temperature is advantageously between 20° C. and 500° C., preferably between 100° C. and 500° C., more preferentially between 200° C. and 400° C., even more preferentially between 250° C. and 350° C. The thermal annealing temperature may be between 100° C. and 700° C.

According to a first implementation, water exhibits a saturated vapour pressure within the second gaseous atmosphere 3, denoted by $P_{sat}$, and step c) includes the steps of:

$c_1$) gradually increasing a heating temperature of the second gaseous atmosphere 3 until reaching the thermal annealing temperature;

$c_2$) measuring progressive heating temperatures over step $c_1$) and determining $P_{sat}$ for the measured progressive heating temperatures;

$c_3$) gradually increasing, over step $c_1$), the partial water vapour pressure, denoted by $p_v$, within the second gaseous atmosphere such that $p_v \geq P_{sat}\,\varphi_1$.

Step $c_1$) is carried out such that the heating temperature follows a temperature ramp, for example of the order of 10° C./min.

Figure 2:
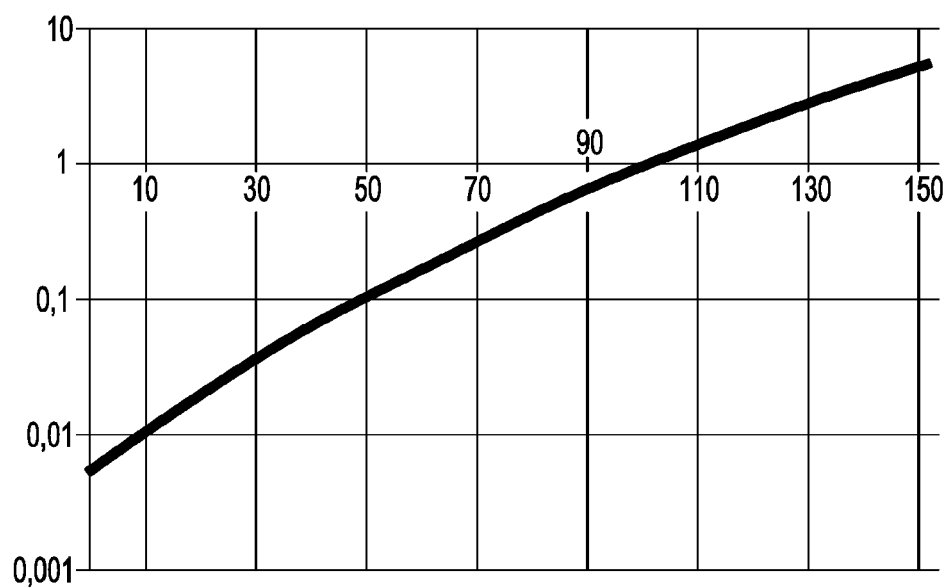
FIG. 2 is a graph showing, as the abscissa, the temperature (in ° C.) and, as the ordinate, the saturated vapour pressure of water (in bars, on a logarithmic scale), obtained by means of the Clapeyron formula.

As illustrated in FIG. 2, step $c_2$) may include a step consisting in determining $P_{sat}$ for any temperature T, for example using the Clapeyron formula:

$$P_{sat}(T) = P_0 \exp\left(\frac{LM}{R}\left(\frac{1}{T_0} - \frac{1}{T}\right)\right)$$

where:
$P_0$ is the reference pressure, equal to 1013.25 hPa;
L is the latent heat of vaporization of water (at 20° C.), equal to 2470 kJ/kg;
M is the molar mass of water, equal to 0.01801 kg/mol;
R is the gas constant, equal to 8.3144621 J·mol$^{-1}$K$^{-1}$;
$T_0$ is the reference temperature, equal to 373.15 K (100° C.).

$P_{sat}$ may therefore be determined by inserting the measured value of the heating temperature into the Clapeyron formula.

Step $c_3$) is carried out by adjusting the flow rate of the injector 40.

According to a second implementation, step c) is carried out so as to saturate the second gaseous atmosphere 3 with water vapour such that $\varphi_2$ is equal to 100%.

In other words, step c) is carried out by injecting enough water vapour, using the injector 40, continually, i.e. throughout step c), into the second gaseous atmosphere 3 such that $\varphi_2$ is equal to 100%.

Application to the Transfer of Thin Layers

Step a) may include a step $a_1$) consisting in implanting gaseous species into the first substrate 1 (termed the donor substrate), through the first surface 10, so as to form a weakened zone ZS, a useful layer 5 to be transferred (i.e. to be transferred to the second substrate 2, termed the carrier substrate) being delimited by the weakened zone ZS and by the first surface 10 of the first substrate 1. The gaseous species implanted in step $a_1$) preferably include ionized hydrogen atoms. It is also possible to carry out a co-implantation with other gaseous species such as helium. By way of nonlimiting example, when the first substrate 1 is produced in silicon, step $a_1$) may be carried out using ionized hydrogen atoms according to the following parameters:
an energy of 85 keV;
a dose of $5 \times 10^{16}$ at·cm$^{-2}$.

The thermal annealing treatment is advantageously applied in step c) according to a thermal budget that is suitable for splitting the first substrate 1 along the weakened zone ZS so as to expose the useful layer 5. To this end, the thermal annealing temperature of step c) may be between 250° C. and 600° C., or even between 350° C. and 500° C.

According to one variant, the process includes a step d) consisting in splitting the first substrate 1 along the weakened zone ZS so as to expose the useful layer 5, step d) being carried out after step c). The thermal annealing treatment may then be applied in step c) according to a thermal budget corresponding to a fraction (e.g. between 50% and 80%) of the thermal budget needed to split the first substrate 1 along the weakened zone ZS. Such a thermal budget of step c) makes it possible to provide a strong bond at the substrate edge such that the splitting step d) may be carried out under a less humid, or even dry, atmosphere. Step d) may be carried out by means of a complementary heat treatment that is suitable for splitting the first substrate 1 along the weakened zone ZS.

Implementation Example No. 1

The first and second substrates 1, 2 are two (001) silicon wafers of 300 mm in diameter and 775 µm in thickness. One of the two substrates 1, 2 includes a surface layer 12, 22 of oxide obtained by thermal oxidation, and having a thickness of 145 nm. The first and second substrates 1, 2 are cleaned and hydrolysed in baths of ozonated deionized water and in an APM (ammonia-peroxide mixture) solution at 70° C.

The first and second substrates 1, 2 are bonded in step b) by direct bonding at ambient temperature and ambient pressure. The first gaseous atmosphere (ambient air) has a first relative humidity level satisfying $\varphi_1 = 45\%$.

Step c) is carried out in an oven 4, the thermal annealing temperature being equal to 300° C. The gradual increase in temperature is implemented according to a temperature ramp of 10° C./minute. The thermal annealing treatment is applied at the annealing temperature for two hours (plateau phase). Step c) is carried out according to the second implementation, i.e. step c) is carried out by injecting enough water vapour, using the injector 40, continually, i.e. throughout step c), into the second gaseous atmosphere 3 such that $\varphi_2$ is equal to 100%.

The adhesion energy is measured upon completion of step c) by means of the double cantilever beam under prescribed displacement (DCB) technique, involving the splitting of two beams:
a 1 cm-wide beam passing through the edges of the two bonded substrates 1, 2;
a 1 cm-wide beam passing through a central portion of the two bonded substrates 1, 2.

An adhesion energy of 4.8 J/m$^2$ is measured at the edges and an adhesion energy of 4.7 J/m$^2$ is measured in the central portion, i.e. a difference of 100 mJ/m$^2$, which value is much lower than the 700 mJ/m$^2$ of the prior art, which moreover is for a substrate diameter of 300 mm in comparison with the 200 mm diameter of the prior art.

Implementation Example No. 2

The first and second substrates 1, 2 are two (001) silicon wafers of 300 mm in diameter and 775 µm in thickness. One of the two substrates 1, 2 includes a surface layer 12, 22 of oxide obtained by thermal oxidation, and having a thickness of 145 nm. The first and second substrates 1, 2 are cleaned and hydrolysed in baths of ozonated deionized water and in an APM (ammonia-peroxide mixture) solution at 70° C.

The first and second substrates 1, 2 are bonded in step b) by direct bonding at ambient temperature and ambient pressure. The first gaseous atmosphere (ambient air) has a first relative humidity level satisfying $\varphi_1 = 45\%$.

Step c) is carried out in an oven 4, the thermal annealing temperature being equal to 300° C. The gradual increase in temperature is implemented according to a temperature ramp of 10° C./minute. The thermal annealing treatment is applied at the annealing temperature for two hours (plateau phase). Step c) is carried out according to the first implementation, i.e. step c) is carried out by injecting:

- an amount of water vapour into the second gaseous atmosphere 3 during the gradual increase in temperature up to 120° C., such that $\varphi_2$ is kept equal to 50%;
- an amount of water vapour into the second gaseous atmosphere 3 from 120° C. to the plateau phase, such that $\varphi_2$ is equal to 100%.

The adhesion energy is measured upon completion of step c) by means of the double cantilever beam under prescribed displacement (DCB) technique, involving the splitting of two beams:

- a 1 cm-wide beam passing through the edges of the two bonded substrates 1, 2;
- a 1 cm-wide beam passing through a central portion of the two bonded substrates 1, 2.

An adhesion energy of 4.8 J/m² is measured at the edges and an adhesion energy of 4.5 J/m² is measured in the central portion, i.e. a difference of 300 mJ/m², which value is much lower than the 700 mJ/m² of the prior art, which moreover is for a substrate diameter of 300 mm in comparison with the 200 mm diameter of the prior art.

The invention is not limited to the described embodiments. A person skilled in the art is capable of considering all technically feasible combinations thereof, and of substituting them with equivalents.

The invention claimed is:

1. A process for attaching a first substrate to a second substrate by direct bonding, the process comprising:
   a) providing the first and second substrates, each comprising a first surface and an opposite second surface;
   b) bonding the first substrate to the second substrate by direct bonding between the first surfaces of the first and second substrates, b) being carried out under a first gaseous atmosphere having a first relative humidity level denoted by $\varphi_1$; and
   c) applying a thermal annealing treatment to the bonded first and second substrates at a thermal annealing temperature of between 20° C. and 700° C., c) being carried out under a second gaseous atmosphere having a second humidity level denoted by $\varphi_2$, satisfying $\varphi_2 \geq \varphi_1$, wherein
   the bonded first and second substrates are kept, after b) and during execution of c), under an atmosphere having a humidity level higher than or equal to $\varphi_1$ such that adhesion energy of the first surfaces of the first and second substrates is homogenized.

2. The process according to claim 1, wherein water exhibits a saturated vapour pressure within the second gaseous atmosphere denoted by $P_{sat}$, and wherein c) includes:

$c_1$) gradually increasing a heating temperature of the second gaseous atmosphere until reaching the thermal annealing temperature;

$c_2$) measuring progressive heating temperatures over $c_1$) and determining $P_{sat}$ for the measured progressive heating temperatures; and $c_3$) gradually increasing, over $c_1$), the partial water vapour pressure, denoted by $p_v$, within the second gaseous atmosphere such that $p_v \geq P_{sat} \varphi_1$.

3. The process according to claim 1, wherein $\varphi_2$ is equal to 100%.

4. The process according to claim 1, wherein c) is carried out such that the second gaseous atmosphere exhibits a constant pressure.

5. The process according to claim 1, wherein the first and second gaseous atmospheres include air.

6. The process according to claim 1, wherein c) is carried out in an oven injecting water vapour, produced by ultrasound, into the second gaseous atmosphere.

7. The process according to claim 1, wherein the thermal annealing temperature is between 20° C. and 500° C.

8. The process according to claim 1, wherein
   a) includes $a_1$) implanting gaseous species into the first substrate, through the first surface, so as to form a weakened zone (ZS), a useful layer being delimited by the weakened zone (ZS) and by the first surface of the first substrate; and
   the thermal annealing treatment is applied in c) according to a thermal budget that is suitable for splitting the first substrate along the weakened zone (ZS) so as to expose the useful layer.

9. The process according to claim 1, wherein
   a) includes $a_1$) implanting gaseous species into the first substrate, through the first surface, so as to form a weakened zone (ZS), a useful layer being delimited by the weakened zone (ZS) and by the first surface of the first substrate; and
   c) is followed by d) splitting the first substrate along the weakened zone (ZS) so as to expose the useful layer.

10. The process according to claim 1, wherein the first surfaces of the first and second substrates are produced in a material selected from Si, $SiO_2$, Ge, $Al_2O_3$, SiC, AsGa, InP, GaN, $LiNbO_3$, $LiTaO_3$.

11. The process according to claim 1, wherein b) is carried out at a temperature of between 20° C. and 30° C.

12. The process according to claim 1, wherein the thermal annealing temperature is between 100° C. and 500° C.

13. The process according to claim 1, wherein the thermal annealing temperature is between 200° C. and 400° C.

14. The process according to claim 1, wherein the thermal annealing temperature is between 250° C. and 350° C.

* * * * *